United States Patent
Reitsma

(10) Patent No.: US 10,571,241 B2
(45) Date of Patent: Feb. 25, 2020

(54) RESONANT INDUCTIVE SENSING WITH ACTIVE RESONATOR TARGET

(71) Applicant: Texas Instruments Incorporated, Dallas, TX (US)

(72) Inventor: George P Reitsma, Redwood City, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 651 days.

(21) Appl. No.: 14/584,853

(22) Filed: Dec. 29, 2014

(65) Prior Publication Data

US 2015/0184993 A1 Jul. 2, 2015

Related U.S. Application Data

(60) Provisional application No. 61/921,960, filed on Dec. 30, 2013.

(51) Int. Cl.
| | | |
|---|---|---|
| *G01R 27/02* | (2006.01) | |
| *G01B 7/00* | (2006.01) | |
| *H03K 17/95* | (2006.01) | |
| *H03K 17/97* | (2006.01) | |

(52) U.S. Cl.
CPC ......... *G01B 7/003* (2013.01); *H03K 17/9547* (2013.01); *H03K 17/97* (2013.01); *H03K 2217/958* (2013.01)

(58) Field of Classification Search
CPC ......... G01R 27/02; G01B 7/003; H03K 17/97
See application file for complete search history.

(56) References Cited

U.S. PATENT DOCUMENTS

| | | | | |
|---|---|---|---|---|
| 3,270,338 | A * | 8/1966 | Watters | B61L 25/04 307/413 |
| 7,825,655 | B1 * | 11/2010 | Stabel | G01B 7/14 324/207.15 |
| 2002/0079908 | A1 * | 6/2002 | Hohl | G01R 27/2611 324/654 |
| 2003/0030485 | A1 * | 2/2003 | Pobanz | H03B 27/00 327/560 |
| 2003/0048186 | A1 * | 3/2003 | Machul | H03K 17/9547 340/572.5 |
| 2005/0219005 | A1 * | 10/2005 | Waible | H03B 5/1228 331/167 |

(Continued)

*Primary Examiner* — Alvaro E Fortich
(74) *Attorney, Agent, or Firm* — John R. Pessetto; Charles A. Brill; Frank D. Cimino

(57) ABSTRACT

A resonant inductive sensing system includes an active resonator target that balances losses in the target resonator. The resonant sensor includes a sensor resonator LC circuit and a resonant target including a target resonator Lt/Ct circuit characterized by a loss factor Rts and a target quality factor Qt. The sensor resonator LC circuit and the target resonator Lt/Ct circuit are configured for operation as coupled resonators. The resonant sensor includes a sensor circuit configured to drive the resonant sensor, such that the sensor resonator LC circuit projects a magnetic sensing field based on a sensor quality factor Q, and an active negative resistance circuit −Ra coupled to the target resonator Lt/Ct circuit, and configured to substantially cancel the loss factor Rts, such that target quality factor Qt is substantially Qt= (√[Lt/Ct]/Rts)(RaRts/[RaRts−Lt/Ct]).

18 Claims, 1 Drawing Sheet

(56) References Cited

U.S. PATENT DOCUMENTS

| | | | |
|---|---|---|---|
| 2006/0214264 A1* | 9/2006 | Sze | H01L 27/0808 257/532 |
| 2008/0116883 A1* | 5/2008 | Ruehl | G01D 5/2093 324/207.17 |
| 2009/0140728 A1* | 6/2009 | Rollins | G01B 7/023 324/207.16 |
| 2010/0295627 A1* | 11/2010 | Okada | H03B 5/1228 331/117 FE |
| 2010/0327940 A1* | 12/2010 | Eisenstadt | H03F 3/45183 327/357 |
| 2011/0148536 A1* | 6/2011 | Italia | H03B 5/1268 331/117 FE |
| 2012/0309305 A1* | 12/2012 | Kim | H04B 5/0031 455/41.1 |
| 2013/0009715 A1* | 1/2013 | Chang | H03B 5/1228 331/117 FE |
| 2013/0049483 A1* | 2/2013 | Kim | H02J 7/025 307/104 |
| 2013/0277351 A1* | 10/2013 | Lamesch | B60N 2/002 219/202 |
| 2014/0340174 A1* | 11/2014 | Lababidi | H03H 7/0123 333/202 |

* cited by examiner

RESONANT INDUCTIVE SENSING WITH ACTIVE RESONATOR TARGET

CROSS-REFERENCE TO RELATED APPLICATIONS

Priority is claimed under USC § 119(e) to U.S. Provisional Application 61/921,960, filed 30 Dec. 2013.

BACKGROUND

Technical Field

This Patent Disclosure relates generally to resonant inductive sensors and sensing, such as can be used in sensing position or proximity.

Related Art

Inductive sensors include an inductive sensor (coil) that inductively couples to a conductive target within its sensing range. For example, inductive sensors are used to sense proximity/position of the target.

Resonant inductive proximity/position sensors use a sensor resonator (LC tank circuit) configured for operation in a resonance state (resonant frequency and amplitude). Sensor electronics drives an AC excitation synchronized with resonator oscillation voltage to maintain resonance (steady state oscillation), overcoming a resonator loss factor represented by a resonator impedance (such as a series/parallel resistance Rs/Rp). For example, in the case of inductive sensing, the resonator includes an inductive sensing coil that, operated at resonance, projects a magnetic sensing field.

Resonant sensing is based on changes in resonance state manifested by, for example, changes in resonator amplitude and frequency resulting from changes in resonator impedance in response to a conductive target. For example, in case of inductive sensing, resonance is affected by a storage or loss in projected magnetic flux energy output from the inductive sensing coil, such as caused by the eddy current effect associated with a conductive target. This sensor response is manifested as a change in resonator impedance (loss factor Rs/Rp).

Resonant inductive sensors operated with a conductive target (such as ferrous metallic) have a limited sensing range of about +/−50% of the sensor coil diameter. Using a target resonator configured for operation with the sensor resonator can extend this range to about 500% the sensor coil diameter. In this configuration, the sensor resonator and target resonator form coupled resonators.

BRIEF SUMMARY

This Brief Summary is provided as a general introduction to the Disclosure provided by the Detailed Description and Figures, summarizing some aspects and features of the Disclosure. It is not a complete overview of the Disclosure, and should not be interpreted as identifying key elements or features of the invention, or otherwise characterizing or delimiting the scope of the invention disclosed in this Patent Document.

The Disclosure is directed to the problem of sensing using a resonant sensor, such as for sensing position, proximity or physical state or condition. The Disclosure describes apparatus and methods for resonant inductive sensing with an active resonator target.

According to aspects of the Disclosure, a methodology for resonant inductive sensing is suitable for proximity/position sensing with a resonant sensor. The resonant sensor includes a sensor resonator LC circuit and a resonant target including a target resonator Lt/Ct circuit characterized by a loss factor Rts and a target quality factor Qt. The sensor resonator LC circuit and the target resonator Lt/Ct circuit are configured for operation as coupled resonators.

The methodology includes (a) driving the resonant sensor such that the sensor resonator LC circuit projects a magnetic sensing field based on a sensor quality factor Q, and (b) generating an active negative resistance −Ra coupled to the target resonator Lt/Ct circuit, so as to substantially cancel the loss factor Rts, such that the target quality factor Qt is substantially $Qt=(\sqrt{[Lt/Ct]}/Rts)(RaRts/[RaRts-Lt/Ct])$. In described examples, the active negative resistance −Ra can be generated by an operational transconductance amplifier, and the active negative resistance −Ra can be constrained greater than an impedance of the target resonator circuit Lt/Ct, thereby substantially eliminating autonomous oscillation of the target resonator.

Other aspects and features of the invention claimed in this Patent Document will be apparent to those skilled in the art from the following Disclosure.

DESCRIPTION

This Description and the Figures constitute a Disclosure of example embodiments and applications that illustrate various features and advantages of resonant inductive proximity/position sensing with an active resonator target.

In brief overview, an resonant inductive sensing system suitable for proximity/position sensing includes an active resonator target that balances losses in the target resonator. The resonant inductive sensing system is suitable for proximity/position sensing with a resonant sensor including a sensor resonator LC circuit and a resonant target including a target resonator Lt/Ct circuit characterized by a loss factor Rts and a target quality factor Qt. The sensor resonator LC circuit and the target resonator Lt/Ct circuit are configured for operation as coupled resonators.

In example embodiments, the resonant inductive sensing system is implemented by a sensor circuit and an active negative resistance circuit −Ra. The sensor circuit/IC is configured to drive the resonant sensor, such that the sensor resonator LC circuit projects a magnetic sensing field based on a sensor quality factor Q. The active negative resistance circuit/IC −Ra is coupled to the target resonator Lt/Ct circuit, and configured to substantially cancel the loss factor Rts, and thereby correspondingly configure the target quality factor Qt as substantially $Qt=(\sqrt{[Lt/Ct]}/Rts)(RaRts/[RaRts-Lt/Ct])$.

In example embodiments, the active negative resistance circuit −Ra (for example, a transconductance amplifier) can be configured to be greater than an impedance of the target resonator circuit Lt/Ct, thereby substantially eliminating autonomous oscillation of the target resonator (for example, with a design constraint −Ra is $Ra>1/Rs*Lt/Ct$).

Figure 1:
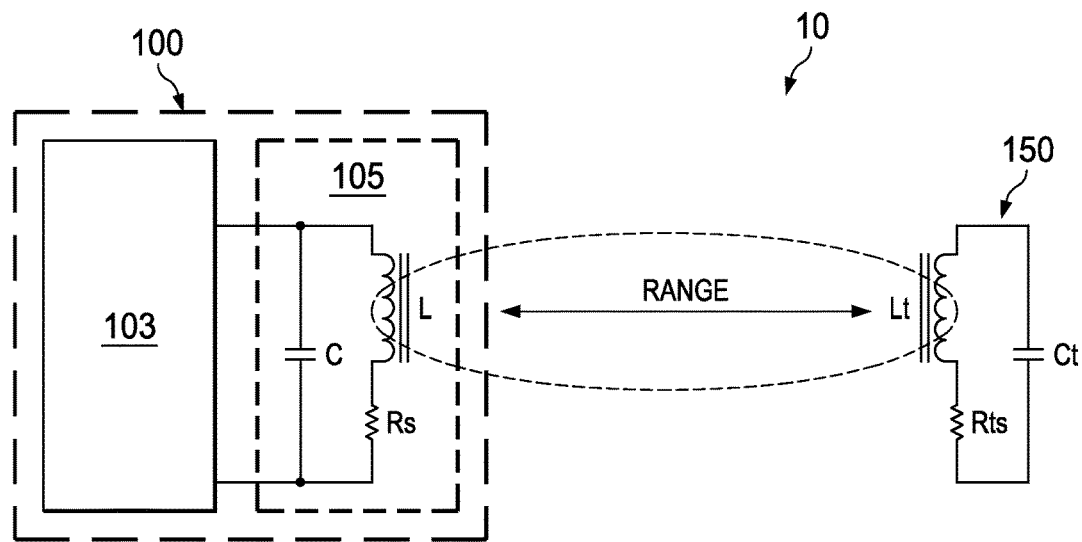
FIG. 1 illustrates inductive sensing system with a resonant target.

FIG. 1 functionally illustrates an inductive sensing system 10 with a passive resonant target. Sensing system 10 includes a sensor 100, and a resonant target 150. Sensor 100 includes sensor electronics 103 and a resonant inductive sensor 105.

Resonant sensor 105 is represented by a sensor resonator LC (tank) circuit, with a loss factor represented by Rs. Resonant target 150 is represented as a target resonator Lt/Ct (tank) circuit, with a loss factor represented by Rts. For proximity/position sensing, resonant sensor 105 and resonant target 150 form coupled resonators (LC and Lt/Ct), with sensor coil L inductively coupling to target coil Lt. As noted in the Background, using coupled resonators, proximity sensing range can be extended to about 500% the coil diameter.

Sensor resonator LC and target resonator Lt/Ct are configured with substantially identical resonant frequencies. Sensor resonator LC is characterized by a quality factor Q ($Q=\sqrt{(L/C)}/Rs$), and the target resonator is characterized by a quality factor Qt ($Qt=\sqrt{(Lt/Ct)}/Rts$). The quality factors Q and Qt are limited by the loss factors represented by the Rs and Rts impedances associated with respectively the LC and Lt/Ct resonators.

Figure 2:
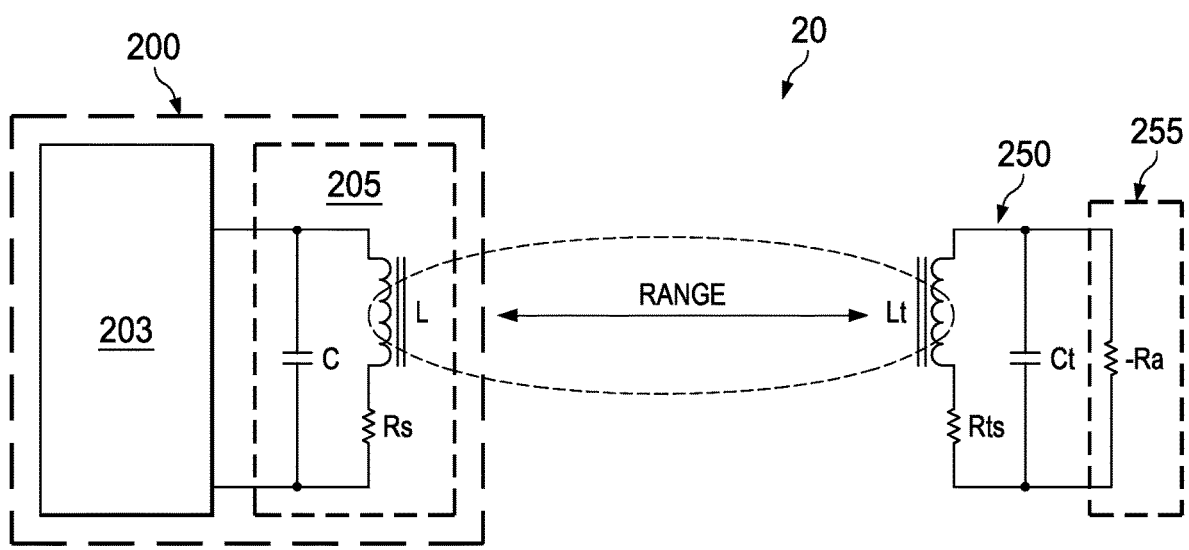
FIG. 2 illustrates an example embodiment of an inductive sensing system with an active resonator target.

FIG. 2 illustrates an example embodiment of a resonant inductive sensing system 20 suitable for proximity/position sensing, including an active resonator target. Sensing system 20 includes a sensor 200, and a resonant target 250. Sensor 200 includes sensor electronics 203 and a resonant sensor 205.

Resonant sensor 205 is represented by a sensor resonator LC (tank) circuit, with a loss factor represented by Rs. Sensor electronics 203 drives an AC current into sensor resonator LC to maintain a resonance state (steady state oscillation). At resonance, sensor resonator coil L generates/projects a magnetic sensing field.

Resonant target 250 is represented as a resonator Lt/Ct (tank) circuit, with a loss factor represented by Rts. For proximity sensing, resonant sensor 205 and resonant target 250 form coupled resonators (LC and Lt/Ct), with sensor coil L inductively coupling to target coil Lt. Sensor resonator LC and target resonator Lt/Ct are configured with substantially identical resonant frequencies.

The magnetic field projected by sensor resonator LC magnetically couples to a proximate resonant target 250, inducing a current in the target resonator Lt/Ct. The magnetic field induced in the target inductor coil Lt is in turn coupled back into the sensor inductor coil L as back-emf.

This back-emf from resonant target 250, into resonant sensor 205, can be sensed by sensor electronics 203.

Sensor resonator LC is characterized by a quality factor Q limited by a loss factor Rs ($Q=\sqrt{(L/C)}/Rs$). The AC drive current (supplied by sensor electronics 203) is amplified by the Q-factor, amplifying the magnetic field projected by the sensor inductor coil L by the same Q factor.

Since the frequency of sensor resonator LC matches the resonant frequency of target resonator Lt/Ct, the magnetically coupled (induced) current is in turn amplified by the target quality factor Qt of resonant target 205 (target resonator Lt/Ct).

According to aspects of the invention, Resonant target 205 is configured as an active resonator, significantly extending sensing range for resonant inductive sensing system 20. Active resonant target 205 is functionally configured with an active negative resistance $-Ra$ (negative impedance) in parallel with the target resonator Lt/Ct. An active negative resistance $-Ra$ can be implemented with an operational trans-admittance amplifier (OTA), or other suitable circuit design.

Active negative resistance $-Ra$ balances the tank losses represented by Rts, significantly enhancing the quality factor Qt of the target resonator: $Qt=(\sqrt{[Lt/Ct]}/Rts)(RaRts/[RaRts-Lt/Ct])$. That is, active negative resistance $-Ra$ is introduced to cancel a significant portion of the target resonator Lt/Ct tank losses represented by Rts. For example, the target quality factor Qt can be enhanced by more than 10×.

For the example embodiment, the active negative resistance $-Ra$ is configured to be greater than the resonance impedance of the target tank circuit: $Ra>1/Rs*Lt/Ct$. This configuration inhibits autonomous oscillation of the target resonator.

The Disclosure provided by this Description and the Figures sets forth example embodiments and applications, including associated operations and methods, that illustrate various aspects and features of the invention. Known circuits, functions and operations are not described in detail to avoid unnecessarily obscuring the principles and features of the invention. These example embodiments and applications can be used by those skilled in the art as a basis for design modifications, substitutions and alternatives to construct other embodiments, including adaptations for other applications. Accordingly, this Description does not limit the scope of the invention, which is defined by the Claims.

The invention claimed is:

1. A resonant inductive sensing system, comprising:
    a resonant sensor including a sensor resonator circuit, operable to project a magnetic sensing field, the sensor resonator circuit including a sensor inductor coil with a sensor inductance L, and a sensor coil diameter Ld, and including a sensor capacitance C; and
    an active resonant target including:
    a target resonator circuit, having a loss factor Rts and a target quality factor Qt; and
    an active negative resistance circuit to drive the target resonator circuit with an active negative resistance $-Ra$ to cancel the loss factor Rts, and thereby correspondingly increase target quality factor Qt, such that a sensing ramie for the resonant sensor is extended at least sixty percent and up to five hundred percent larger than the sensor coil diameter Ld.

2. The system of claim 1,
    wherein the target resonator circuit is characterized by the sensor inductor coil with inductance Lt and a resonator capacitor with capacitance Ct; and
    wherein the target quality factor Qt of the target resonator circuit is $Qt=(\sqrt{[Lt/Ct]}/Rts)(RaRts/[RaRts-Lt/Ct])$.

3. The system of claim 1, wherein the active negative resistance $-Ra$ is greater than an impedance of the target resonator circuit, thereby eliminating autonomous oscillation of the target resonator.

4. The system of claim 3,
    wherein the target resonator circuit is characterized by the sensor inductor coil with inductance Lt and a resonator capacitor with capacitance Ct; and
    wherein the active negative resistance $-Ra$ is $Ra>1/Rs*Lt/Ct$.

5. The system of claim 1, wherein the active negative resistance circuit comprises an operational transconductance amplifier.

6. A resonant inductive sensing circuit for use in a system including a resonant sensor with a sensor resonator circuit, and a resonant target, the resonant sensor operable to project a magnetic sensing field, the sensor resonator circuit including a sensor inductor coil with a sensor inductance L, and a sensor coil diameter Ld, and including a sensor capacitance C the resonant target including a target resonator circuit having a loss factor Rts and a target quality factor Qt, the circuit comprising:

an active negative resistance circuit to drive the target resonator circuit with an active negative resistance −Ra;

the active negative resistance circuit and the target resonator circuit are operable to form a coupled resonator with the sensor resonator circuit; and the active negative resistance −Ra controlled to cancel the loss factor Rts, and thereby correspondingly increase target Quality factor Qt, such that a sensing ramie for the resonant sensor is extended at least sixty percent and up to five hundred percent larger than the sensor coil diameter Ld.

7. The circuit of claim 6, wherein the active negative resistance −Ra is greater than an impedance of the target resonator circuit, thereby eliminating autonomous oscillation of the target resonator.

8. The circuit of claim 7,
wherein the target resonator circuit is characterized by the sensor inductor coil with inductance Lt and a resonator capacitor with capacitance Ct; and
wherein the active negative resistance −Ra is Ra>1/Rs*Lt/Ct.

9. The circuit of claim 1, wherein the active negative resistance circuit comprises an operational transconductance amplifier.

10. A method of resonant inductive sensing for use in a system with a resonant sensor including a sensor resonator circuit and a resonant target, the sensor resonator circuit including a sensor inductor coil with a sensor coil diameter Ld and with an sensor inductance L, and a sensor capacitance C, the resonant target including a target resonator circuit having a loss factor Rts and a target quality factor Qt, the method comprising:

driving the sensor resonator circuit to project a magnetic sensing field; and driving the target resonator circuit with an active negative resistance −Ra to cancel the loss factor Rts, and thereby correspondingly increase target Quality factor Qt, such that a sensing ramie for the resonant sensor is extended at least sixty percent and up to five hundred percent larger than the sensor coil diameter Ld.

11. The method of claim 10, wherein the active negative resistance −Ra is greater than an impedance of the target resonator circuit, thereby eliminating autonomous oscillation of the target resonator.

12. The method of claim 11,
wherein the target resonator circuit is characterized by the sensor inductor coil with inductance Lt and a resonator capacitor with capacitance Ct; and
wherein the active negative resistance −Ra is Ra>1/Rs*Lt/Ct.

13. The method of claim 10, wherein the active negative resistance −Ra is generated by an operational transconductance amplifier.

14. The circuit of claim 6,
wherein the target resonator circuit is characterized by the sensor inductor coil with inductance Lt and a resonator capacitor with capacitance Ct; and
wherein the target quality factor Qt is Qt=($\sqrt{[Lt/Ct]}$/Rts)(RaRts/[RaRts−Lt/Ct]).

15. The system of claim 1, wherein the sensor resonator circuit and the target resonator circuit are operable to form coupled resonators for proximity sensing.

16. The circuit of claim 6, wherein the target sensor resonator circuit is operable with the sensor resonator circuit for proximity sensing.

17. The method of claim 10, wherein the sensor resonator circuit and the target resonator circuit are operable to form coupled resonators for proximity sensing.

18. The method of claim 10,
wherein the target resonator circuit is characterized by the sensor inductor coil with inductance Lt and a resonator capacitor with capacitance Ct; and
wherein the target quality factor Qt is Qt=($\sqrt{[Lt/Ct]}$/Rts)(RaRts/[RaRts−Lt/Ct]).

* * * * *